(12) United States Patent
Okura

(10) Patent No.: US 10,870,920 B2
(45) Date of Patent: Dec. 22, 2020

(54) GAS SUPPLY DEVICE AND VALVE DEVICE

(71) Applicant: TOKYO ELECTRON LIMITED, Tokyo (JP)

(72) Inventor: Shigeyuki Okura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 701 days.

(21) Appl. No.: 15/325,161

(22) PCT Filed: Jul. 6, 2015

(86) PCT No.: PCT/JP2015/003380
§ 371 (c)(1),
(2) Date: Jan. 10, 2017

(87) PCT Pub. No.: WO2016/009608
PCT Pub. Date: Jan. 21, 2016

(65) Prior Publication Data
US 2017/0183773 A1    Jun. 29, 2017

(30) Foreign Application Priority Data

Jul. 17, 2014  (JP) ................................ 2014-147035

(51) Int. Cl.
*C23C 16/455*  (2006.01)
*C23C 16/34*  (2006.01)
*F16K 27/00*  (2006.01)
*C23C 16/44*  (2006.01)
*F16K 11/22*  (2006.01)

(52) U.S. Cl.
CPC ........ *C23C 16/45544* (2013.01); *C23C 16/34* (2013.01); *C23C 16/4408* (2013.01);
(Continued)

(58) Field of Classification Search
CPC . F16K 11/22; F16K 27/003; C23C 16/45527; C23C 16/45544;
(Continued)

(56) References Cited

U.S. PATENT DOCUMENTS 2,837,282 A * 6/1958 Budde .................... F16K 11/24
 236/12.13
4,991,625 A * 2/1991 Manganaro ............... E03C 1/04
 137/606

(Continued)

FOREIGN PATENT DOCUMENTS

JP 2005-327864 A 11/2005
JP 2009-038408 A 2/2009
(Continued)

OTHER PUBLICATIONS

International Search Report dated Oct. 6, 2015 corresponding to International application No. PCT/JP2015/003380.

*Primary Examiner* — Kevin F Murphy
*Assistant Examiner* — Jonathan J Waddy
(74) *Attorney, Agent, or Firm* — Nath, Goldberg & Meyer; Jerald L. Meyer

(57) ABSTRACT

A technology, when forming a film by supplying $TiCl_4$ gas and $NH_3$ gas a plurality of times in alternation to a substrate, can increase the amount of gas flow while suppressing cooling of a valve device, and contribute to an increase in throughput. In the formation of the film, the gas for atmosphere replacement supplied into a processing vessel between supplying one processing gas and supplying the other processing gas is heated ahead of time. Thus, the flow rate of gas can be increased while suppressing cooling of the gas-contacting sites such as a wafer and the inner wall of the processing vessel, and so it is possible to reduce the time necessary to replace the atmosphere, resulting in being able to contribute to increased throughput, and problems such as adhesion of reaction products due to cooling at the valve device are suppressed.

11 Claims, 12 Drawing Sheets

(52) U.S. Cl.
CPC .. *C23C 16/45527* (2013.01); *C23C 16/45561* (2013.01); *C23C 16/45587* (2013.01); *F16K 11/22* (2013.01); *F16K 27/003* (2013.01); *Y10T 137/8766* (2015.04); *Y10T 137/87684* (2015.04)

(58) Field of Classification Search
CPC ........ C23C 16/45561; C23C 16/45587; C23C 16/34; C23C 16/4408; Y10T 137/8766; Y10T 137/87684
USPC ........... 137/606, 607, 861, 896, 897, 599.11, 137/625.29; 427/255.23, 255.7
See application file for complete search history.

(56) References Cited

U.S. PATENT DOCUMENTS

| | | | | |
|---|---|---|---|---|
| 5,181,538 | A * | 1/1993 | Manganaro | E03C 1/04 137/607 |
| 7,066,194 | B2 * | 6/2006 | Ku | F16K 7/16 118/719 |
| 2003/0079686 | A1 * | 5/2003 | Chen | C23C 16/34 118/715 |
| 2003/0121608 | A1 * | 7/2003 | Chen | C23C 16/34 156/345.33 |
| 2003/0172872 | A1 * | 9/2003 | Thakur | C23C 16/4412 118/715 |
| 2003/0235961 | A1 * | 12/2003 | Metzner | C23C 16/30 438/287 |
| 2004/0011404 | A1 * | 1/2004 | Ku | F16K 7/16 137/341 |
| 2008/0202416 | A1 * | 8/2008 | Provencher | C23C 16/45536 118/715 |
| 2014/0076444 | A1 * | 3/2014 | Maskell | F16K 11/076 137/861 |

FOREIGN PATENT DOCUMENTS

| | | |
|---|---|---|
| JP | 2009-524244 A | 6/2009 |
| KR | 1020130076751 A | 12/2012 |

* cited by examiner

GAS SUPPLY DEVICE AND VALVE DEVICE

TECHNICAL FIELD

The present disclosure relates to a gas supply device used to perform a film forming process on a substrate within a process vessel under a vacuum atmosphere, and a valve device used in the gas supply device.

BACKGROUND

As a method of forming a film on a semiconductor wafer (hereinafter, referred to as a "wafer") as a substrate, an atomic layer deposition (ALD) method of alternately supplying a raw material gas and a reaction gas reacting with the raw material gas to a wafer a plurality of times to deposit a molecular layer of a reaction product on a surface of the wafer so as to obtain a thin film is known.

In the ALD method, it is required to supply a substitution gas for substituting a process atmosphere between the supply of the raw material gas and the supply of the reaction gas. Thus, it is important to rapidly substitute an atmosphere to obtain high throughput. For example, Patent Document 1 discloses a method in which, in order to prevent entry of another process gas to a flow passage of a process gas, an inert gas is constantly supplied, and when the supply of the process gas is stopped, the process gas of a process vessel is substituted with the inert gas as a substitution gas. In this case, in order to increase substitution efficiency of the process gas, a flow rate of the inert gas may be increased. However, when the flow rate of the inert gas is increased, a deposition rate may be lowered as a partial pressure of the process gas is lowered.

Further, the interior of the process vessel is heated by a heating mechanism in order to suppress generation of particles based on adsorption or re-liquefaction of the process gas. However, when a flow rate of the substitution gas is increased, the interior of the process vessel is likely to be cooled by the substitution gas, leading to a state where the process gas is adsorbed to remain on a gas contact portion or re-liquefied or re-solidified.

PRIOR ART DOCUMENTS

Patent Document

Japanese laid-open publication No. 2009-038408 (the paragraph 0038)

SUMMARY

The present disclosure provides some embodiments of a technique capable of increasing a flow rate of a substitution gas, while suppressing cooling of a gas contact portion, in forming a film by alternately supplying different process gases to a substrate a plurality of times, thus contributing to enhancement of throughput.

Further, the present disclosure provides some embodiments of a valve device suitable for performing the aforementioned technique.

According to one embodiment of the present disclosure, a gas supply device for sequentially supplying a first reaction gas as a process gas, a substitution gas for substituting an atmosphere, and a second reaction gas as a process gas into a process vessel, in which a substrate is placed, under a vacuum atmosphere, a plurality of cycles includes: a process gas flow passage configured to supply the process gas into the process vessel; a substitution gas flow passage configured to supply the substitution gas into the process vessel; and a substitution gas heating part installed in the substitution gas flow passage to heat the substitution gas.

According to another embodiment of the present disclosure, a valve device in which a first valve body part configured to open and close a flow passage in a first valve chamber and a second valve body part configured to open and close a flow passage in a second valve chamber are successively installed includes: a first gas introduction port, a second gas introduction port, and a gas discharge port; a first gas flow passage connected to the first valve chamber from the first introduction port and opened and closed by the first valve body part; a gas discharge flow passage extending from the first valve chamber to the gas discharge port; a second gas flow passage as an inert gas flow passage configured to communicate with the gas discharge flow passage from the second gas introduction port through an orifice so as not to be opened and closed by each of the first valve body part and the second valve body part; and a bypass flow passage as a substitution gas flow passage formed to join in a downstream side of the orifice in the second gas flow passage from the second gas introduction port through the second valve chamber, and opened and closed by the second valve body part.

According to the present disclosure, in forming a film by alternately supplying different process gases to a substrate a plurality of times, a substitution gas for atmosphere substitution supplied into a process vessel is heated in advance by a substitution gas heating part between the supply of one process gas and the supply of the other process gas. Thus, since a flow rate of the substitution gas can be increased, while suppressing cooling of a gas contact portion such as an inner wall of the process vessel or the substrate, it is possible to shorten the time necessary for substituting an atmosphere, contribute to enhancement of throughput, and suppress occurrence of a problem such as adhesion of a reaction product due to the cooling of the gas contact portion.

DETAILED DESCRIPTION

Figure 1:
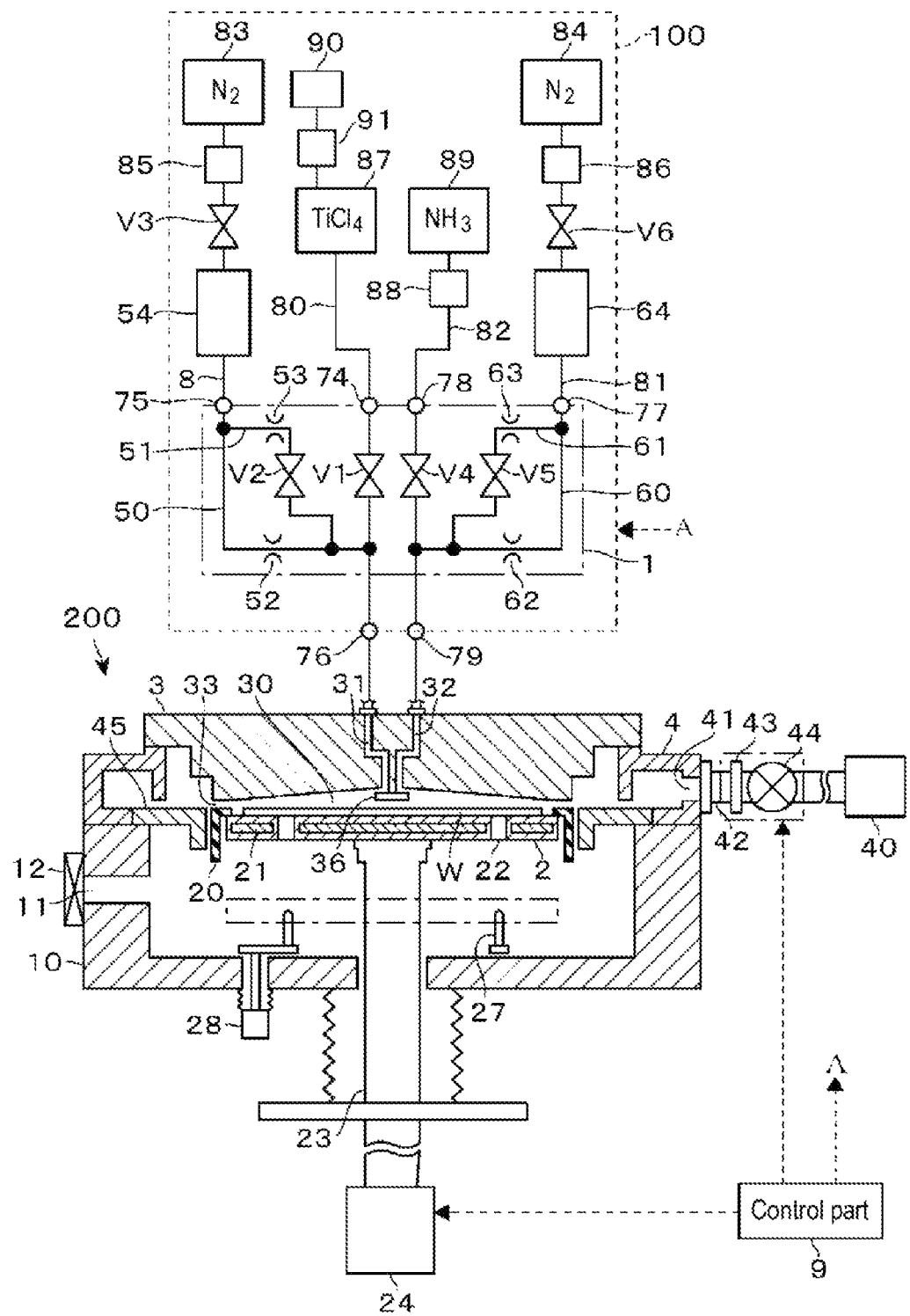
FIG. 1 is a cross-sectional view of an ALD device having a gas supply device used in an embodiment of the present disclosure.

An embodiment in which a gas supply device according to an embodiment of the present disclosure is applied to an ALD device as a film forming device for forming a film on a substrate will be described. FIG. 1 illustrates an overall configuration of the ALD device. The ALD device includes a device main body part 200 and a gas supply device 100, and is configured to form a TiN film through an ALD method by alternately supplying a $TiCl_4$ gas and an $NH_3$ gas to a surface of a wafer W as a substrate.

The device main body part 200 includes a process vessel 10 serving as a vacuum chamber, a mounting table 2, which is configured to be moved up and down by an elevation mechanism 24 through an elevation shaft 23, is installed between a processing position for performing a film forming process on the wafer W and an exchange position for exchanging the wafer W within the process vessel 10, and a heater 21 is embedded in the mounting table 2. In the exchange position, the wafer W is exchanged between, for example, three push-up pins 27 for pushing up the wafer W through a hole portion 22 formed in the mounting table 2 by a push-up mechanism 28, and a transfer mechanism (not shown), which is installed in, for example, an external vacuum transfer chamber and enters through a loading/unloading port 11, which is opened and closed by a gate valve 12.

FIG. 1 illustrates a state where the mounting table 2 is placed in the processing position, and an upper space and a lower space of the mounting table 2 is partitioned with a gap 33 therebetween by the mounting table 2, a cylindrical cover member 20 installed around the mounting table 2 and an annular partition member 45 of a side of the process vessel 10. A lower surface of a ceiling portion 3 of the process vessel 10 widens from a central portion toward a lower side slantingly to form a flat conical space, and a space between the ceiling portion 3 and the mounting table 2 becomes a processing space 30. Two gas supply paths 31 and 32 that pass through in a thickness direction are formed in the central portion of the ceiling portion 3, and a dispersion plate 36 for dispersing a gas discharged from the gas supply paths 31 and 32 into the processing space 30 is installed, for example, horizontally, in a lower side of the gas supply paths 31 and 32.

An exhaust duct 4 is installed to be bent in an annular shape to surround the ambience of the processing space 30. An inner peripheral surface of the exhaust duct 4 is opened in a circumferential direction, and a gas flowing from the processing space 30 is exhausted into the exhaust duct 4. An exhaust pipe 42 is connected to an outer peripheral surface of the exhaust duct through an exhaust port 41 that passes through the process vessel 10. The exhaust pipe 42 is connected to a vacuum exhaust pump 40 from a side of the exhaust port 41 through a pressure regulating part 43 and an opening/closing valve 44.

Further, a temperature rising mechanism such as a heater (not shown) is installed within a sidewall of the process vessel 10 or within the ceiling portion 3, and an internal temperature of the ceiling portion 3 and the process vessel 10 is set to, for example, 150 degrees C. Thus, for example, adsorption of the process gas in the process vessel 10 is suppressed.

The gas supply device 100, which is configured to supply a $TiCl_4$ gas as a raw material gas, an $NH_3$ gas as a reaction gas, and an inert gas, for example, an $N_2$ gas, as an anti-backflow gas or a substitution gas, is connected to the gas supply paths 31 and 32. The $TiCl_4$ gas as the raw material gas corresponds to a first reaction gas and the $NH_3$ gas as the reaction gas corresponds to a second reaction gas.

The gas supply device 100 includes a $TiCl_4$ gas flow passage 80 as a raw material gas flow passage for supplying the $TiCl_4$ gas, an $NH_3$ gas flow passage 82 as a reaction gas flow passage for supplying the $NH_3$ gas, and two $N_2$ gas flow passages 8 and 81 for supplying the $N_2$ gas.

An $N_2$ gas supply source 83, a pressure regulating part 85, a base valve V3 and a substitution gas heating part 54 are installed in the $N_2$ gas flow passage 8 in this order from an upstream side, and a downstream side thereof is connected to the valve device 1. Similarly, an $N_2$ gas supply source 84, a pressure regulating part 86, a base valve V6, and a substitution gas heating part 64 are also installed in the $N_2$ gas flow passage 81 in this order from the upstream side, and a downstream side thereof is connected to the valve device 1. The substitution gas heating parts 54 and 64 have a cylindrical vessel formed to allow a gas to flow in a spiral shape, and a heater for heating the interior of the flow passage from the outside of the flow passage, and heat the $N_2$ gas to, for example, 180 degrees C. to 300 degrees C.

A $TiCl_4$ storage part 87 is installed in the $TiCl_4$ gas flow passage 80, and heated by a heater (not shown) to 80 to 90 degrees C. such that $TiCl_4$ is stored in a liquid state. Further, a carrier gas supply part 90 is connected to the $TiCl_4$ storage part 87, and it is configured such that a raw material stored in the $TiCl_4$ storage part 87 is supplied by the $N_2$ gas or the like (for example, a flow rate of 50 sccm) supplied from the carrier gas supply part 90. In addition, a flow rate adjusting part 91 for controlling a flow rate of the carrier gas is installed, and a vaporization amount of the $TiCl_4$ gas is adjusted by a flow rate of the carrier gas, so that a flow rate of the $TiCl_4$ gas is adjusted. An $NH_3$ gas supply source 89 and a flow rate adjusting part 88 are installed in the $NH_3$ gas flow passage 82 in this order from the upstream side. A downstream side of the $TiCl_4$ storage part 87 and a downstream side of the flow rate adjusting part 88 in the $NH_3$ gas flow passage 82 are connected to the valve device 1.

Figure 2:
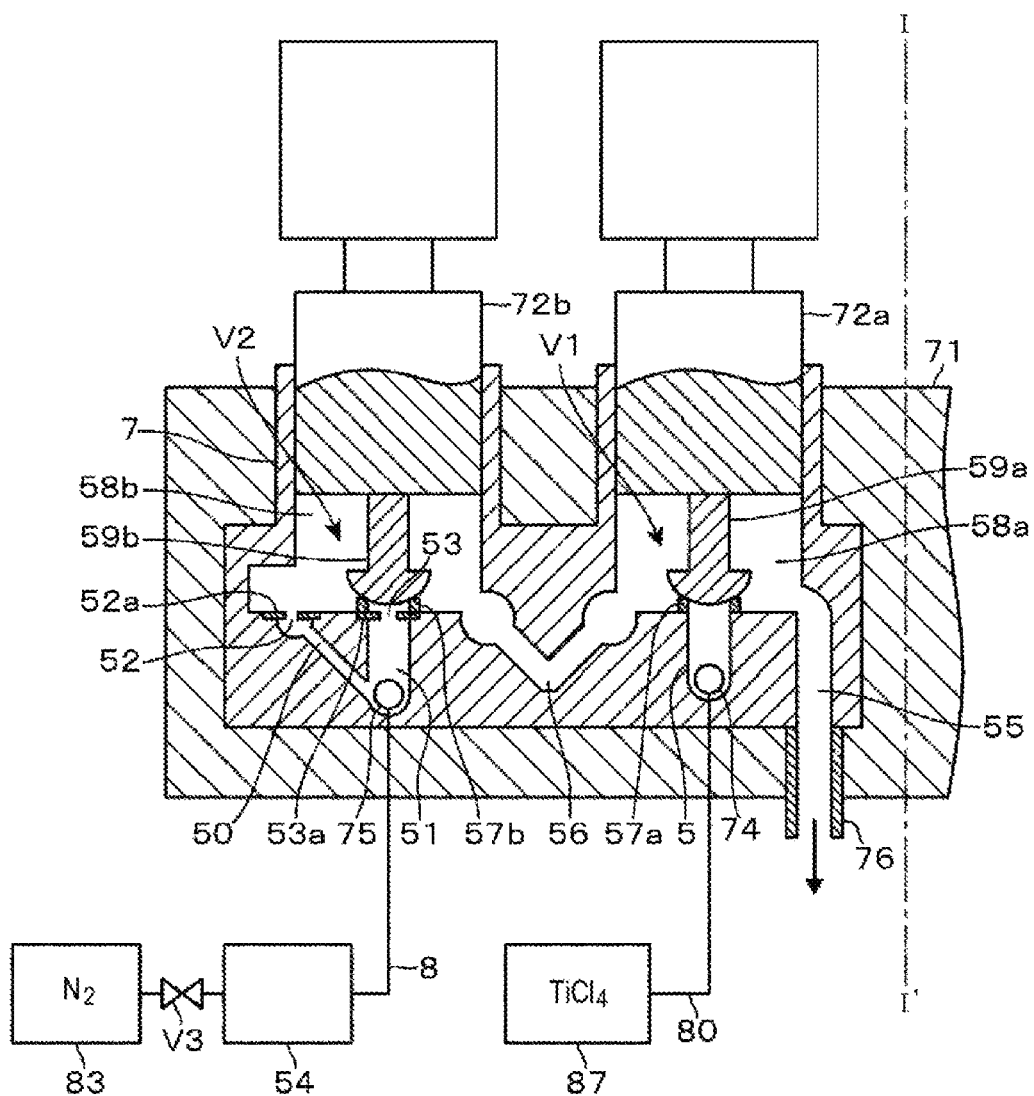
FIG. 2 is a cross-sectional view illustrating a valve device according to an embodiment of the present disclosure.

In FIG. 1, a portion surrounded by the dashed dotted line illustrates the flow passage or the like within the valve device 1 as a piping diagram, and FIG. 2 illustrates a structure of the valve device 1. The valve device 1 is constituted in a single component in which a hole passage forming a gas flow passage is formed within a block body 7, which is formed of, for example, stainless steel or the like, and has a substantially rectangular shape, and a flow passage opening/closing part including first and second valve sheets 57a and 57b and first and second valve body parts 59a and 59b connected to the hole passage is formed. In FIG. 1, within the valve device 1, a portion corresponding to the flow passage opening/closing part including the first valve sheet 57a and the first valve body part 59a is indicated as a valve V1 and a portion corresponding to the flow passage opening/closing part including the second valve sheet 57b and the second valve body part 59b is indicated as a valve V2. Further, in an $NH_3$ supply system side, a portion corresponding to the valve V1 is indicated as a valve V4, and a portion corresponding to the valve V2 is indicated as a valve V5.

In the valve device 1, a TiCl$_4$ gas system portion, which joins the TiCl$_4$ gas flow passage 80, is configured as a structure having a 2-way valve as illustrated in FIG. 2, and a portion formed as an NH$_3$ gas system portion, which joins the NH$_3$ gas flow passage 82, is also configured as the same structure as that illustrated in FIG. 2. The structure configured as the NH$_3$ gas system portion is arranged in a horizontal direction of a space with the structure forming the TiCl$_4$ gas system portion illustrated in FIG. 2 to be integrated in this example. Thus, the valve device 1 may be a structure having a 4-way valve including two structures, each having the 2-way valve. The structure forming the TiCl$_4$ gas system portion corresponds to a first valve part and the structure forming the NH$_3$ gas system portion corresponds to a second valve part. Thus, regarding the structure of the valve device 1, only the structure (first valve) forming the TiCl$_4$ gas system portion will be described with reference to FIG. 2.

The valve device 1 has the block body 7, and a TiCl$_4$ gas introduction hole 74 as a first gas introduction port through which a TiCl$_4$ gas is introduced, and an N$_2$ gas introduction hole 75 as a second gas introduction port through which an N$_2$ gas is introduced, are formed to be parallel to each other on the side of the block body 7.

A process gas flow passage 5 in which the TiCl$_4$ gas introduction hole 74 is opened on the side thereof and which extends upwardly is formed in the block body 7. Further, a first valve chamber 58a having a cylindrical shape in which the process gas flow passage 5 as a first reaction gas flow passage is opened on a lower surface thereof is formed within the block body 7. In the first valve chamber 58a, the annular first valve sheet 57a is installed to surround the opening of the process gas flow passage 5, and the first valve body part 59a for opening and closing the first valve sheet 57a is disposed. The first valve body part 59a is connected to a driving part 72a disposed on an upper surface side of the block body 7. The driving part 72a movers up and down the first valve body part 59a within the first valve chamber 58a. The first valve body part 59a is a member having a mushroom shape in which a front end of a cylinder is curved to have a hemispherical shape, and is disposed such that the front end thereof faces downwardly.

Further, a gas discharge flow passage 55 extends downwardly from a peripheral portion of a lower surface of the first valve chamber 58a, and is connected to the gas discharge hole 76, which is a gas discharge port, through the lower surface of the block body 7.

A bypass flow passage 51 illustrated in FIG. 1 in which the N$_2$ gas introduction hole 75 is opened on the side thereof and which extends upwardly is formed in the block body 7. A second valve chamber 58b having a cylindrical shape in which the bypass flow passage 51 is opened on a lower surface thereof is formed within the block body 7. In the second valve chamber 58b, the annular second valve sheet 57b is installed to surround the opening of the bypass flow passage 51, and a second valve body part 59b for opening and closing the second valve sheet 57b is disposed. The second valve body part 59b is connected to a driving part 72b disposed on an upper surface side of the block body 7. The driving part 72b moves up and down the second valve body part 59b within the second valve chamber 58b.

Further, the opening of the bypass flow passage 51 in the second valve chamber 58b is blocked by an orifice forming member 53a having a disk shape, and a hole portion forming an orifice 53 having a caliber of 0.1 to 1.0 mm is formed in the orifice forming member 53a. The orifice forming part 53a may also be used as the second valve sheet 57b.

In addition, an N$_2$ gas introduction passage 50 slantingly extending upwardly from the N$_2$ gas introduction hole 75 and connected to a peripheral portion of the second valve chamber 58b is formed in the block body 7. In the second valve chamber 58b, the opening of the N$_2$ gas introduction passage 50 is blocked by the orifice forming member 52a having a disk shape, and a hole portion forming the orifice 52 having a caliber of 0.1 to 1.0 mm is formed in the orifice forming member 52a. Further, a V-shaped flow passage 56 is formed in a peripheral portion of a lower surface of the second valve chamber 58b, and slantingly extends toward a lower side and then slantingly changes direction toward an upper side so as to be connected to a peripheral portion of a lower surface of the first valve chamber 58a.

In the valve device 1, a flow passage of the TiCl$_4$ gas introduction hole 74→first valve chamber 58a→gas discharge flow passage 55→gas discharge hole 76 corresponds to a portion from the TiCl$_4$ gas introduction hole 74 of the TiCl$_4$ gas flow passage 80 to the gas discharge hole 76 illustrated in FIG. 1. Further, a flow passage of the N$_2$ gas introduction hole 75→N$_2$ gas introduction path 50 and bypass flow passage 51→second valve chamber 58b→V-shaped flow passage 56→first valve chamber 58a→gas discharge flow passage 55→gas discharge hole 76 corresponds to a portion from the N$_2$ gas introduction hole 75 of the N$_2$ gas flow passage 8 to the gas discharge hole 76 illustrated in FIG. 1.

Further, in the following description of operation, opening the valve V1 (or V2) refers to a state where the first valve body part 59a (or the second valve body part 59b) is spaced apart from the first valve sheet 57a (or the second valve sheet 57b). Also, closing the valve V1 (or V2) refers to a state where the first valve body part 59a (or the second valve body part 59b) is moved down to be seated on the first valve sheet 57a (or the second valve sheet 57b).

As illustrated in FIG. 1, the valve device 1 installed in a portion where the NH$_3$ gas flow passage 82 and the N$_2$ gas flow passage 81 join is configured to have a mirror plane symmetry with respect to the line I-I' of FIG. 2, except that the first gas introduction port is formed as an NH$_3$ gas introduction hole 78 and, instead of the TiCl$_4$ gas, an NH$_3$ gas is supplied, as illustrated in FIG. 1. Further, in FIG. 1, reference numeral 79 denotes a gas discharge hole, reference numeral 77 denotes an N$_2$ gas introduction hole, reference numeral 60 denotes an N$_2$ gas introduction path, and reference numeral 63 denotes an orifice installed in a bypass flow passage 61. Further, in the valve device 1, for example, a heating mechanism 71 having an aluminum jacket and a mantle heater is installed to surround the block body 7, and a wall surface of a gas flow passage in the valve device 1 is heated to have a temperature of, for example, 150 degrees C.

In addition, the ALD device includes a control part 9. The control part 9 is configured as, for example, a computer, and includes a program, a memory, and a CPU. The program has a group of steps S embedded to perform a series of operations in the following description of operations, and an opening/closing operation of each valve V1 to V6, a flow rate adjusting operation of each gas, a pressure regulating operation of an internal pressure of the process vessel 10 and the like are executed according to the program. The program is stored in a computer storage medium, for example, a flexible disc, a compact disc, a hard disc, a magneto-optical disc, or the like and installed in the control part 9.

Figure 3:
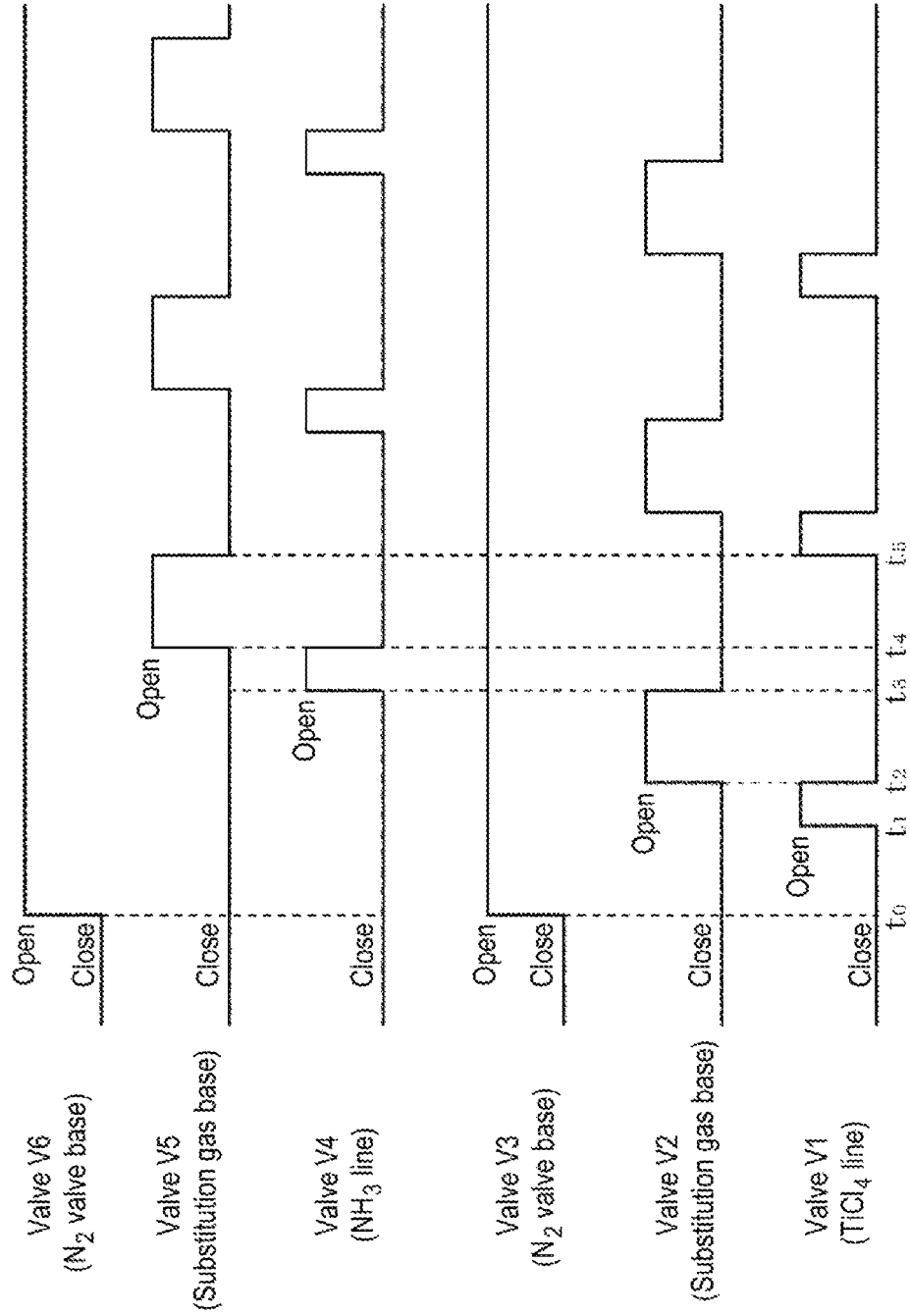
FIG. 3 is a timing chart illustrating a gas supply sequence in the embodiment of the present disclosure.
Figure 7:
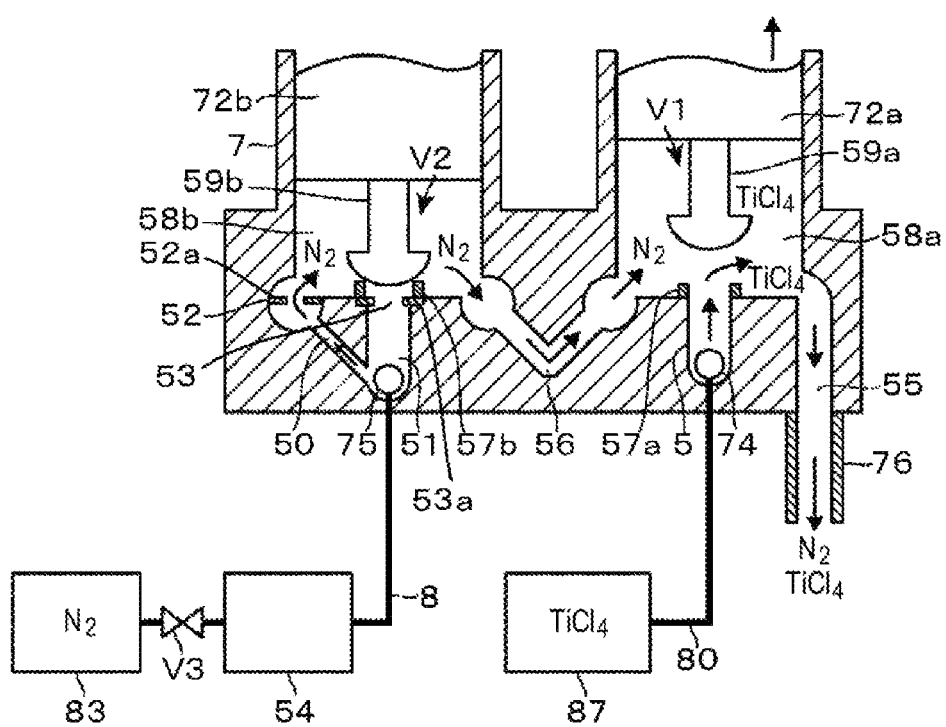
FIG. 7 is an explanatory view illustrating supply of a gas by the valve device.
Figure 8:
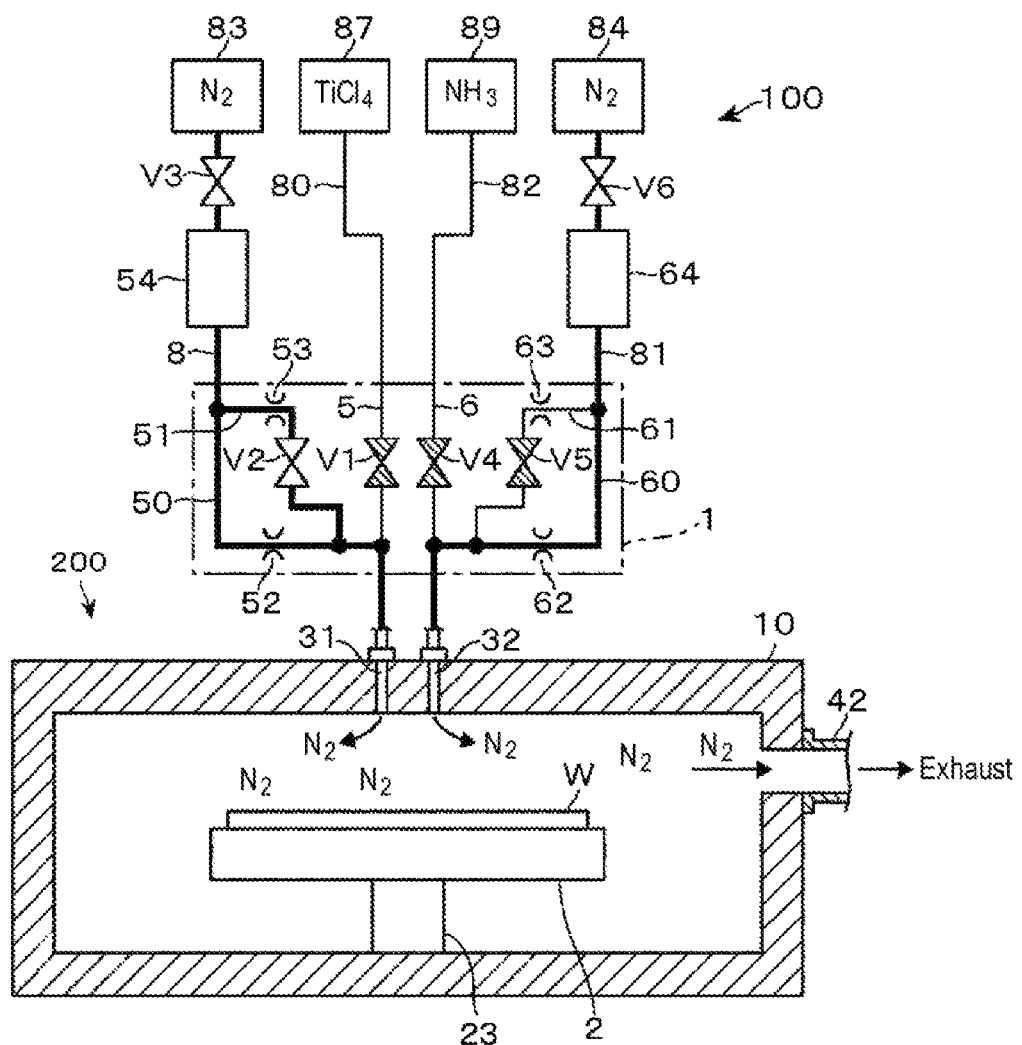
FIG. 8 is an explanatory view illustrating supply of a gas by the gas supply device according to the embodiment of the present disclosure.
Figure 9:
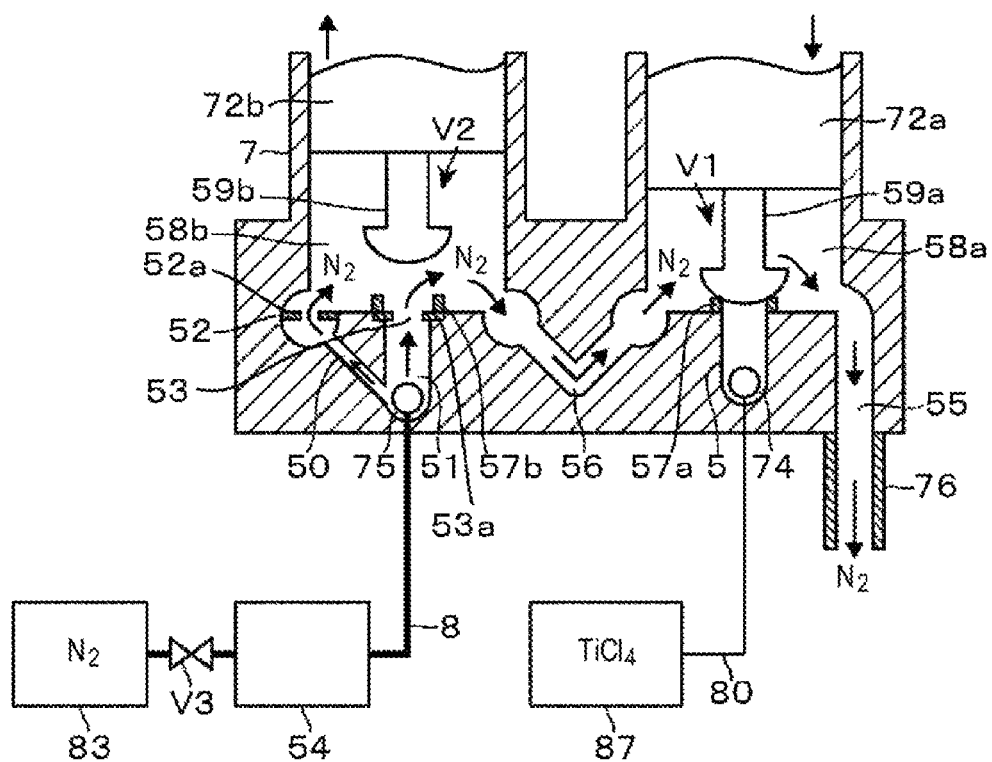
FIG. 9 is an explanatory view illustrating supply of a gas by the valve device.

Next, an operation of the embodiment of the present disclosure will be described. FIG. 3 is a timing chart of opening/closing of each valve V1 to V6 (supply/stop of gas) in an ALD film forming process. Further, FIGS. 4, 6, 8, 10, and 11 are views illustrating a state where a gas is supplied from the gas supply device 100 into the process vessel 10, and FIGS. 5, 7, and 9 illustrate an operation of the valve device 1 when a gas is supplied. Also, in FIGS. 4, 6, 8, 10, and 11, the device main body part 200 is simplified to facilitate understanding of the described content. Also, the opening diameter of the orifice 53 is exaggerated. Further, in the explanatory drawings illustrating the gas supply after FIG. 4, hatching is illustrated in a closed valve for convenience.

First, after the wafer W is mounted on the mounting table 2 by a transfer mechanism within an external vacuum transfer chamber (not shown), the gate valve 12 is closed and the wafer W is heated by the heater 21 installed in the mounting table 2 to, for example, 350 degrees C. Further, a temperature of a wall surface of the process vessel 10 is set to, for example, 170 degrees C. by a heater (not shown) installed in the process vessel 10.

Figure 4:
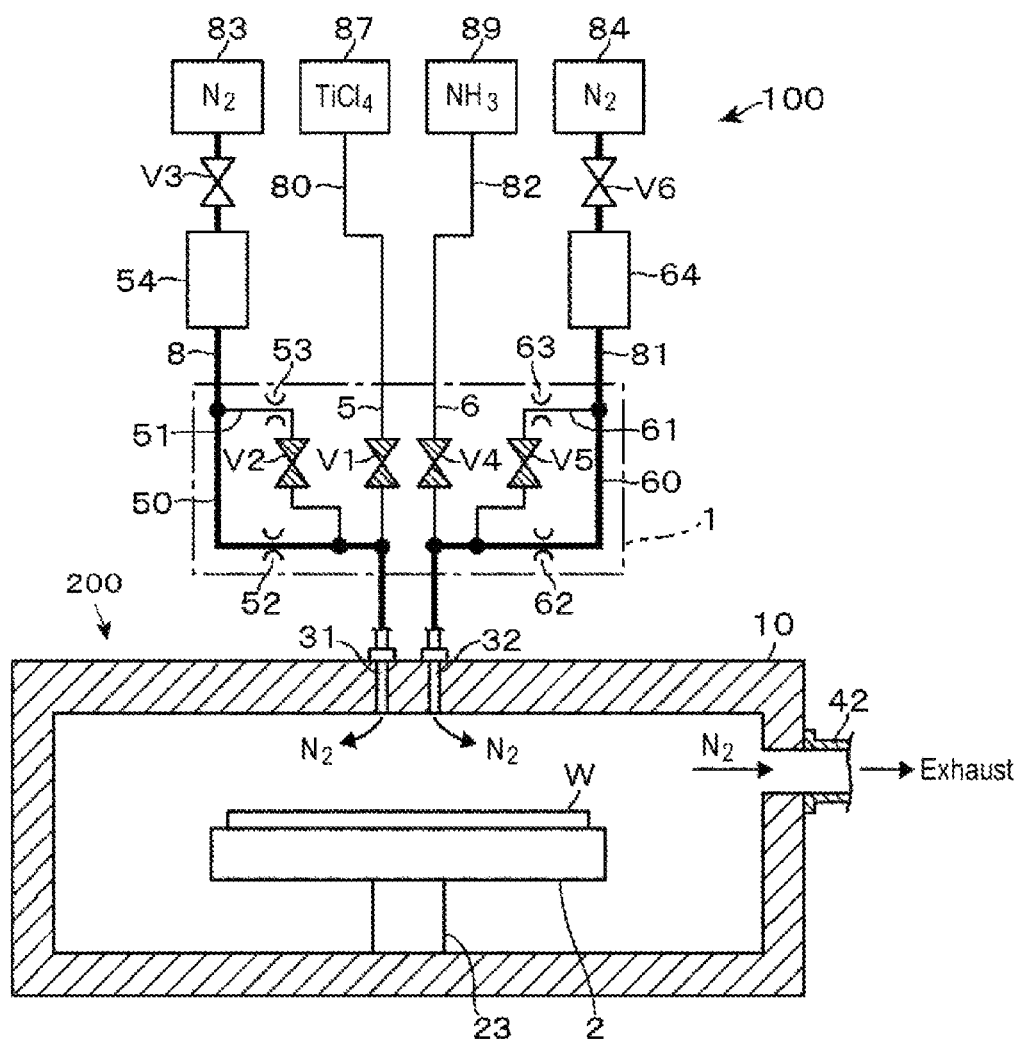
FIG. 4 is an explanatory view illustrating supply of a gas by the gas supply device according to the embodiment of the present disclosure.
Figure 5:
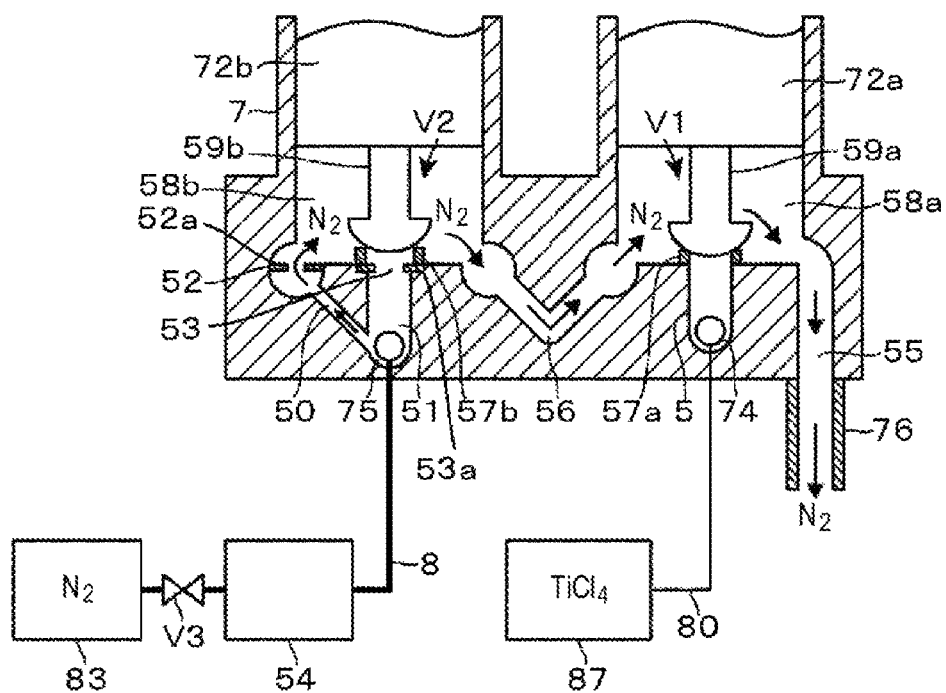
FIG. 5 is an explanatory view illustrating supply of a gas by the valve device.

Further, at time t0 illustrated in FIG. 3, the base valves V3 and V6 of the $N_2$ gas flow passages 8 and 81 are opened as illustrated in FIG. 4. At this time, as can be seen from FIG. 5, although the valve V2 is closed, the $N_2$ gas introduced through the $N_2$ gas introduction hole 75 within the valve device 1 passes through the $N_2$ gas introduction path 50, the orifice 52, the second valve chamber 58b, the V-shaped flow passage 56, the first valve chamber 58a, the gas discharge flow passage 55, and the gas discharge hole 76. Thus, the $N_2$ gas is supplied from the $N_2$ gas supply sources 83 and 84 into the process vessel 10 through the $N_2$ gas flow passages 8 and 81 and the gas supply paths 31 and 32, respectively. The $N_2$ gas introduction path 50 and the orifice 52 correspond to a first inert gas flow passage. The $N_2$ gas is heated by the substitution gas heating parts 54 and 64 to, for example, 300 degrees C., and is also set to a flow rate of, for example, 3000 sccm, in each of the $N_2$ gas flow passages 8 and 81.

Figure 6:
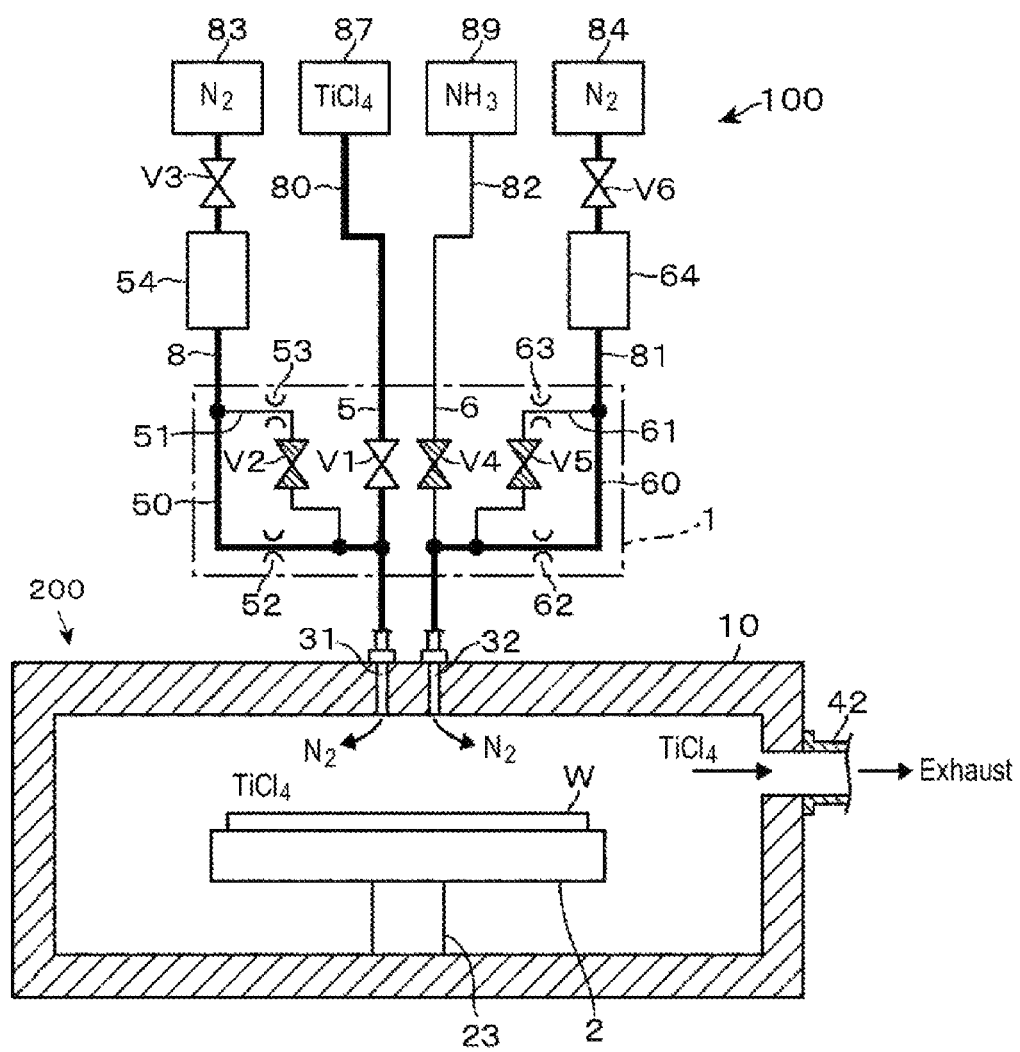
FIG. 6 is an explanatory view illustrating supply of a gas by the gas supply device according to the embodiment of the present disclosure.

Subsequently, the mounting table 2 is moved up to the processing position indicated by the solid line in FIG. 1 to form the processing space 30, and thereafter, the valve V1 is opened at time t1 at step S1 as illustrated in FIG. 6. In the valve device 1, as illustrated in FIG. 7, the first valve body part 59a is moved up and a $TiCl_4$ gas is supplied from the process gas flow passage 5 to the first valve chamber 58a. Further, the $N_2$ gas introduced through the V-shaped flow passage 56 and flowing to the gas discharge flow passage 55 through the first valve chamber 58a join with the $TiCl_4$ gas in the first valve chamber 58a. Accordingly, the $TiCl_4$ gas, together with the $N_2$ gas as an inert gas, is introduced from the gas supply path 31 into the process vessel 10 and supplied to the wafer W. At this time, since the $N_2$ gas flows through the gas supply path 32, the $TiCl_4$ gas is suppressed from flowing backwards to the corresponding gas supply path 32. Thus, the $N_2$ gas flowing through the gas supply path 32 may be considered an anti-backflow gas. Further, the $N_2$ gas flowing through the gas supply path 31 is also a gas for preventing backflow of a gas from a process atmosphere.

At time t2 after 0.05 to 0.5 seconds has elapsed from the time t1, the valve V1 is closed and the valve V2 is opened at step S2. Thus, as illustrated in FIG. 8, the supply of the $TiCl_4$ gas is stopped and the $N_2$ gas as a heated substitution gas is introduced into the process vessel 10 through the $N_2$ gas flow passages 8 and 81, the valve device 1, and the gas supply paths 31 and 32. The $N_2$ gas will be described in detail. As illustrated in FIG. 9, as the second valve body part 59b of the valve V2 is moved up, the $N_2$ gas which has been introduced through the $N_2$ introduction hole 75 is introduced to the second valve chamber 58b through the bypass flow passage 51 and the orifice 53 and joins the $N_2$ gas which has come through the orifice 52 described above. The bypass flow passage 51 and the orifice 53 correspond to the first substitution gas flow passage.

The joined $N_2$ gas is introduced, at a flow rate greater than that of the $N_2$ gas serving as an anti-backflow gas when a $TiCl_4$ gas is supplied or when an $NH_3$ gas is supplied, for example, at a flow rate of 10000 sccm, from the valve device 1 into the process vessel 10 through the gas supply path 31. At this time, the $N_2$ gas is also continuously discharged from the gas supply path 32. Thus, these $N_2$ gases serve as substitution gases for substituting an internal atmosphere of the process vessel 10 or supply paths of the process gases such as the gas supply paths 31 and 32 during an idle time in intermittent supply of the process gases ($TiCl_4$ gas and $NH_3$ gas).

Figure 10:
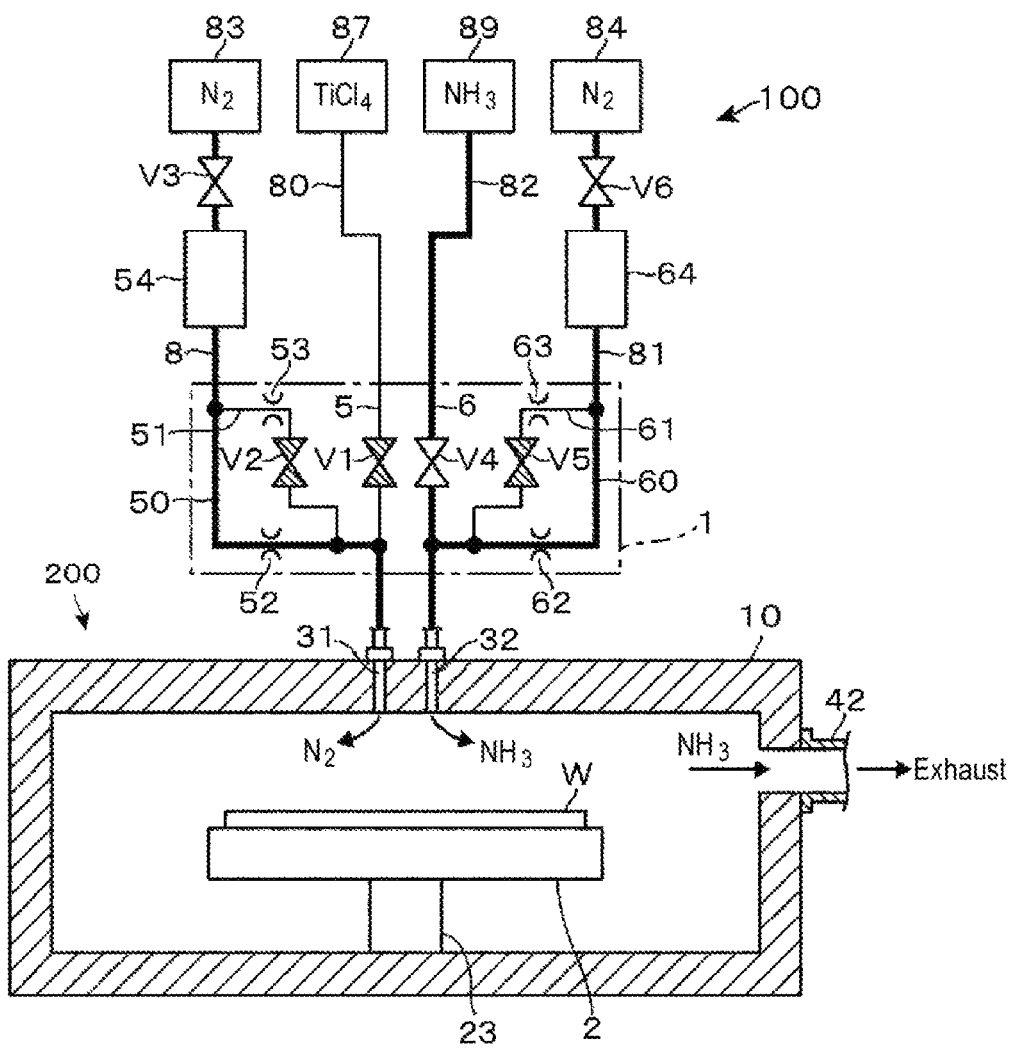
FIG. 10 is an explanatory view illustrating supply of a gas by the gas supply device according to the embodiment of the present disclosure.

Thereafter, at step S3, as illustrated in FIG. 10, the valve V2 is closed and the valve V4 is opened from time t3 after 0.1 to 0.5 seconds have lapsed from the time t2. At this time, like the $TiCl_4$ gas illustrated in FIG. 7, the $NH_3$ gas flows in the valve device 1 of the $NH_3$ gas system side and is introduced together with the $N_2$ gas as an inert gas into the process vessel 10 through the gas supply path 32, and supplied to the wafer W. At this time, since the $N_2$ gas flows through the gas supply path 31, the $NH_3$ gas is suppressed from being introduced to the corresponding gas supply path 31. Thus, the gas flowing through the gas supply path 31 may be an anti-backflow gas. Also, the $N_2$ gas flowing through the gas supply path 32 is a gas preventing backflow of a process atmosphere.

Figure 11:
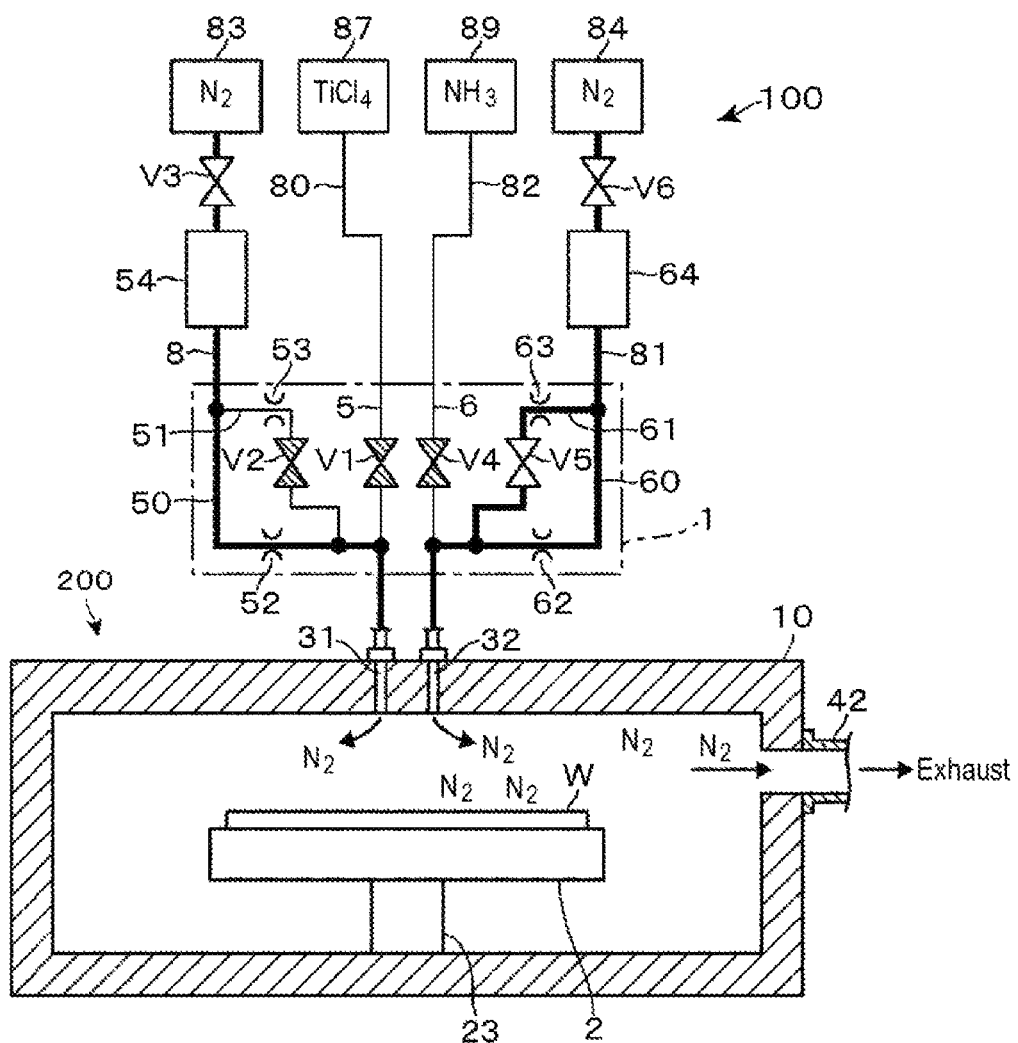
FIG. 11 is an explanatory view illustrating supply of a gas by the gas supply device according to the embodiment of the present disclosure.

Further, the valve V4 is closed and the valve V5 is opened at step S4 from time t4 after 0.05 to 0.5 seconds have lapsed from the time t3. Thus, as illustrated in FIG. 11, the supply of the $NH_3$ gas is stopped and the $N_2$ gas as a heated substitution gas is introduced into the process vessel 10 through the $N_2$ gas flow passages 8 and 81, the valve device 1, and the gas supply paths 31 and 32. At this time, the $N_2$ gas flows within the valve device 1 on the $NH_3$ gas system portion as in FIG. 9, and the $N_2$ gas of, for example, 10000 sccm is introduced as a substitution gas into the process vessel 10.

Further, a cycle including supply of $TiCl_4$ gas→substitution by $N_2$ gas→supply of $NH_3$ gas→substitution of process atmosphere by $N_2$ gas from step S1 to step S4 is repeated a preset number of times, for example, 20 times after time t5. By repeating the cycle, a $TiCl_4$ gas is adsorbed onto the wafer W, the $TiCl_4$ gas and the $NH_3$ gas are subsequently reacted to create a molecular layer of TiN, and the molecular layer of TiN is sequentially stacked to form a TiN film.

After the supply cycle is repeated a preset number of times, the $N_2$ gas is supplied into the process vessel 10 for a while, and thereafter, the mounting table 2 is moved down to a loading/unloading position and the gate valve 12 is opened to unload the wafer W from the process vessel 1.

In the aforementioned embodiment, in performing the ALD, the $N_2$ gas as a substitution gas for substituting an atmosphere is dedicatedly heated by the substitution gas heating parts 54 and 64 independent from the valve device 1. The valve device 1 is also heated by the heating mechanism 71 to promote release of gas from a gas contact portion, however, a heating temperature thereof is limited in consideration of heat resistance of a seal material, and thus, a temperature rises only to, for example, about 150 degrees C. In contrast, when the dedicated substitution gas heating parts 54 and 64 are used, a temperature of the $N_2$ gas can be increased up to a temperature enough to suppress a cooling operation of a gas contact portion when a large amount of $N_2$ gas enough to increase substitution efficiency is supplied.

In the ALD, the time necessary for substituting an atmosphere between a raw material gas (first reaction gas) as a process gas and a reaction gas as (second reaction gas), for example, between the $TiCl_4$ gas and the $NH_3$ gas, affects the throughput. In this embodiment, since a large amount of $N_2$ gas can be supplied, an atmosphere can be substituted within a short time, promoting the enhancement of throughput. Further, when the temperature of a gas contact portion is lowered, as mentioned above, any one of the $TiCl_4$ gas and the $NH_3$ gas adheres to an inner wall of the process vessel 10 to remain thereon and reacts with the other gas to cause a particle to be formed. The present inventor recognized that an adsorption probability of the $NH_3$ gas is reduced as a temperature is higher and increased as a temperature is lower, between 150 degrees C. to 400 degrees C. Further, when the $TiCl_4$ gas and the $NH_3$ gas adhere to the gas supply paths 31 and 32, respectively, there is a possibility that the $NH_3$ gas flows backwards to the gas supply path 31 or the $TiCl_4$ gas flows backwards to the gas supply path 32, causing a reaction within the gas supply paths 31 and 32. In addition, the $TiCl_4$ gas may be re-liquefied on an inner wall of the process vessel 10 or within the gas supply path 31. According to the aforementioned embodiment, this problem can be solved, while allowing a large amount of substitution gas to flow.

Further, the $N_2$ gas for preventing a backflow is supplied into the gas supply paths 31 and 32, and the bypass flow passages 51 and 61 are installed to bypass the orifices 52 and 62 for regulating a flow rate of the $N_2$ gas for preventing a backflow, such that the $N_2$ gas as a substitution gas can be supplied or stopped separately from the $N_2$ gas for preventing a backflow. Thus, when the $TiCl_4$ gas and the $NH_3$ as process gases are supplied, a partial pressure of these process gases can be lowered to avoid lowering of a deposition rate. Further, the valve device 1, which is a so-called multi-way valve in which the valves V1 and V4 for the process gas and the valves V2 and V5 for the $N_2$ gas are successively installed, is used. In addition, a substitution gas is supplied or stopped using the second valve body 59b and the second valve sheet 57b such that the bypass flow passages 51 and 61 of the $N_2$ gas as a substitution gas bypass with respect to the $N_2$ gas introduction paths 50 and 60 as a portion of the $N_2$ gas flow passage for preventing a backflow in the valve device 1. Also, these $N_2$ gas introduction paths 50 and 60 and the bypass flow passages 51 and 61 join in the gas discharge flow passage 55 (see FIG. 2) of the process gas. Thus, the gas supply device is advantageously reduced in size.

The present disclosure is not limited to the aforementioned embodiment, and for example, modifications as described later may be configured.

Figure 12:
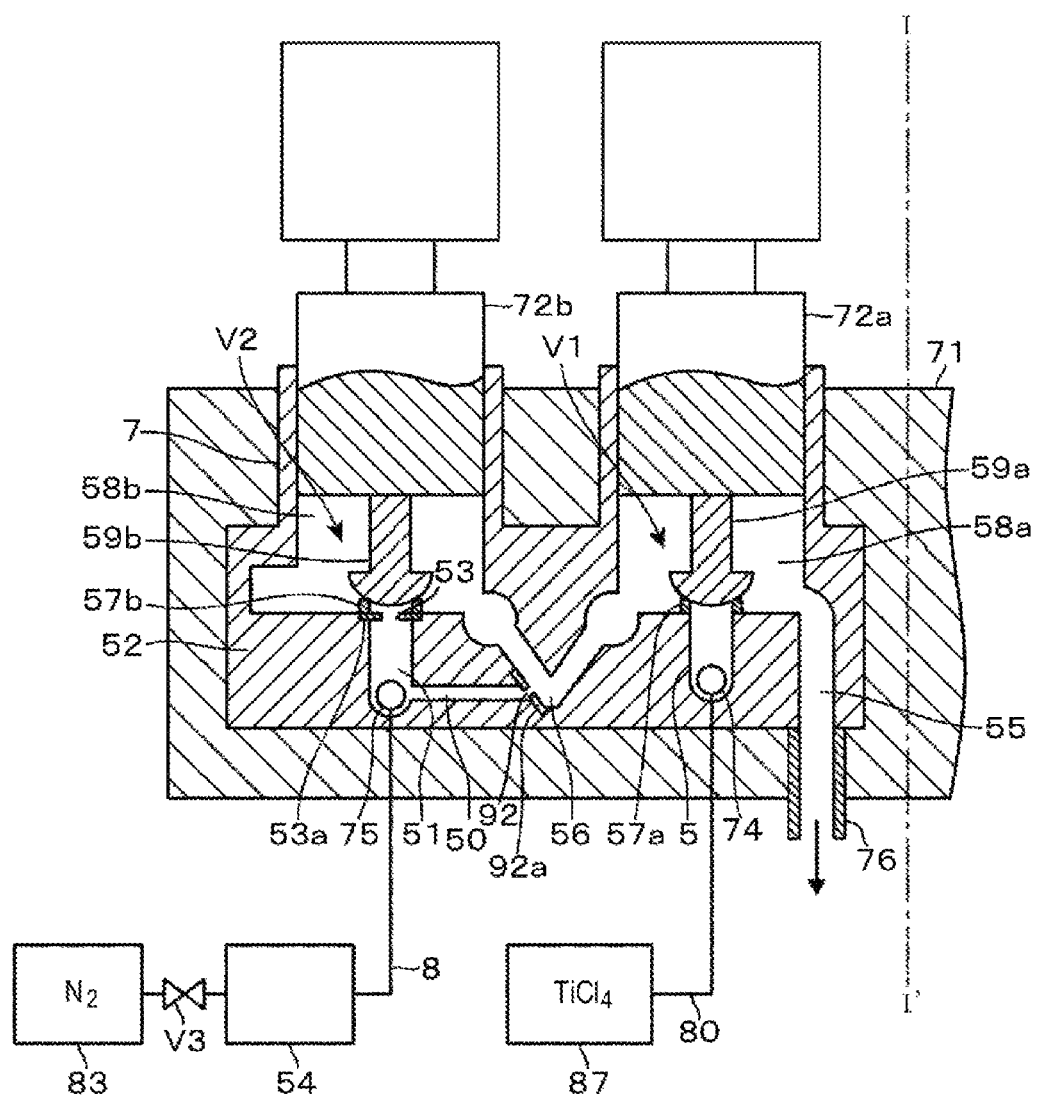
FIG. 12 is a cross-sectional view illustrating another example of the valve device used in the embodiment of the present disclosure.

In the valve device 1, as illustrated in FIG. 12, the gas flow passage 50 of the $N_2$ gas for preventing a backflow may be connected to the V-shaped flow passage 56 through the orifice 92 formed by an orifice forming member 92a, or instead of the structure illustrated in FIG. 12, the $N_2$ gas introduction path 50 may be directly connected to the gas discharge flow passage 55 through the orifice, rather than being connected to the V-shaped flow passage 56. Further, an outlet of a flow passage corresponding to the V-shaped flow passage 56 illustrated in FIG. 2, namely, an outlet of a flow passage after the $N_2$ gas for preventing a backflow and the $N_2$ gas as a substitution gas join may be opened to the gas discharge flow passage 55, without passing through the first valve chamber 58a.

Also, rather than being connected to the second valve chamber 58b, the $N_2$ gas introduction path 50 of the $N_2$ gas for preventing a backflow may be directly connected to the first valve chamber 58a so as not to be opened and closed by the first valve body part 59a, and the flow passage corresponding to the V-shaped flow passage 56 extending from the second valve chamber 58b as described above may be directly connected to the gas discharge flow passage 55, without passing through the first valve chamber 58a. In this case, the orifice 52 installed in the $N_2$ gas introduction path 50 may be configured by applying the same structure as that illustrated in FIG. 2 to an inner wall part of the first valve chamber 58a. Further, the $N_2$ gas introduction path 50 and the bypass flow passage 51 may join in the gas discharge flow passage 55. When the orifice 52 is configured by the orifice forming member 52a in the inner wall part of the valve chambers 58a and 58b, a processing operation is facilitated.

The substitution gas heating parts 54 and 64 of a gas may also be installed in a downstream side of the valve device 1, as well as being installed in an upstream side of the valve device 1.

In the aforementioned embodiment, the valve device (equivalent to the first valve part) of the $TiCl_4$ gas system side is illustrated in FIG. 2, but actually, as mentioned above, the valve device (equivalent to the second valve part) of the $NH_3$ gas system side may also have the same structure as that illustrated in FIG. 2, and the valve device 1 illustrated in FIG. 1 is configured by integrating those two valve devices. However, in the valve device 1, the valve device on the $TiCl_4$ gas system side and the valve device on the $NH_3$ gas system side may also be separately provided.

As a type of film forming process, a silicon oxide film may be formed using an organic silicon source as a raw material gas and an ozone gas as a reaction gas, without being limited to the $TiCl_4$ gas and the $NH_3$ gas. Alternatively, a so-called SiN film may also be formed using a silane-based gas such as a dichlorosilane gas as a raw material gas and an $NH_3$ gas as a reaction gas, or the like.

Further, the present disclosure is not limited to the case of performing ALD. For example, a first CVD (Chemical Vapor Deposition) film may be formed by supplying a process gas for first CVD into the process vessel and a second CVD film is subsequently formed by using a process gas for a second CVD different from the process gas for the first CVD. In this manner, the present disclosure may also be applied to a method of forming a thin film by alternately supplying both process gases into the process vessel 10 a plurality of times through substitution of an atmosphere by a substitution gas. In this case, the process gas for the first CVD corresponds to the first reaction gas and the process gas for the second CVD corresponds to the second reaction gas.

Regarding a flow passage of the $N_2$ gas as a substitution gas, a dedicated flow passage, separated from the flow passages through which the $N_2$ gas for preventing a backflow and the process gas flow, may be installed to supply the same into the process vessel 10.

INDUSTRIAL USE OF THE PRESENT DISCLOSURE

The present disclosure can be effective in the field of a gas supply device used to perform a film forming process on a substrate, and thus has industrial applicability.

EXPLANATION OF REFERENCE NUMERALS

2: mounting table, 9: control part, 10: process vessel, 12: gate valve, 21: heater, 23: elevation shaft, 24: elevation mechanism, 28: push-up mechanism, 40: vacuum exhaust pump

What is claimed is:

1. A valve device in which a first valve body part provided in a first valve chamber and a second valve body part provided in a second valve chamber are successively installed, the device comprising:
   a first gas introduction port, a second gas introduction port, and a gas discharge port;
   a first gas flow passage connected to the first valve chamber from the first gas introduction port, and opened and closed by the first valve body part;
   a gas discharge flow passage extending from the first valve chamber to the gas discharge port;
   a second gas flow passage configured to communicate with the gas discharge flow passage from the second gas introduction port through an orifice, the second valve chamber, and the first valve chamber in this order, so as not to be opened and closed by either of the first valve body part or the second valve body part; and
   a bypass flow passage formed to join in a downstream side of the orifice in the second gas flow passage from the second gas introduction port through the second valve chamber, and opened and closed by the second valve body part,
   wherein the second gas flow passage is opened from the second gas introduction port to the gas discharge flow passage all the time.

2. The device of claim 1, wherein an orifice is installed in the bypass flow passage.

3. The device of claim 1, wherein an opening formed in a wall portion of the second valve chamber is blocked by an orifice forming member and the orifice is configured by a hole portion formed in the orifice forming member.

4. The device of claim 1, wherein the second gas flow passage and the bypass flow passage join and are connected to the first valve chamber so as not to be opened and closed by the first valve body part.

5. A gas supply device for performing a plurality of cycles, each cycle including sequentially supplying a first reaction gas as a first process gas, a substitution gas for substituting an atmosphere, and a second reaction gas as a second process gas into a process vessel, in which a substrate is placed, under a vacuum atmosphere, the gas supply device comprising:
   a process gas flow passage configured to supply the first process gas or the second process gas into the process vessel;
   a substitution gas flow passage configured to supply the substitution gas into the process vessel;
   an inert gas flow passage configured to supply an inert gas to the process gas flow passage when the first process gas or the second process gas is supplied;
   a valve device including a portion where the substitution gas flow passage, the process gas flow passage, and the inert gas flow passage join; and
   a substitution gas heating part installed in the substitution gas flow passage to heat the substitution gas, the substitution gas heating part being installed in at least one of an upstream side and a downstream side of the valve device in the substitution gas flow passage, wherein, in the valve device, a first valve body part provided in a first valve chamber and a second valve body part provided in a second valve chamber are successively installed,
wherein the valve device comprises:
   a first gas introduction port configured to introduce the first process gas or the second process gas, a second gas introduction port configured to introduce the inert gas or the substitution gas, and a gas discharge port;
   a gas discharge flow passage extending from the first valve chamber to the gas discharge port; and
   a heating mechanism installed to promote release of a gas from a gas contact portion within the valve device and configured to heat the first valve chamber, the second valve chamber, the process gas flow passage, the gas discharge flow passage, the inert gas flow passage, and the substitution gas flow passage;
wherein the process gas flow passage is opened to the first valve chamber from the first gas introduction port, and opened and closed by the first valve body part,
wherein the inert gas flow passage is configured to communicate with the gas discharge flow passage from the second gas introduction port through an orifice so as not to be opened and closed by either of the first valve body part or the second valve body part,
wherein the substitution gas flow passage is formed to join in a downstream side of the orifice in the inert gas flow passage from the second gas introduction port through the second valve chamber, and opened and closed by the second valve body part, and
wherein the inert gas and the substitution gas are the same gas.

6. The device of claim 5, wherein an orifice is installed in the substitution gas flow passage.

7. The device of claim 5, wherein an opening formed in a wall portion of the second valve chamber is blocked by an orifice forming member, and the orifice is configured by a hole portion formed in the orifice forming member.

8. The device of claim 5, wherein the inert gas flow passage and the substitution gas flow passage join and are connected to the first valve chamber so as not to be opened and closed by the first valve body part.

9. The device of claim 5, wherein the first reaction gas is a raw material gas containing a raw material forming a thin film to be formed on the substrate, and the second reaction gas is a reaction gas reacting with the raw material gas to create a reaction product on the substrate.

10. The device of claim 5, wherein the first reaction gas and the second reaction gas are reaction gases for forming a film by CVD.

11. A gas supply device for performing a plurality of cycles, each cycle including sequentially supplying a first reaction gas, a substitution gas for substituting an atmosphere, and a second reaction gas into a process vessel, in which a substrate is placed, under a vacuum atmosphere, the device comprising:
   a first reaction gas flow passage configured to supply the first reaction gas into the process vessel;
   a first substitution gas flow passage configured to supply the substitution gas into the process vessel;
   a first inert gas flow passage configured to supply an inert gas to the first reaction gas flow passage when the first reaction gas is supplied;
   a first substitution gas heating part installed in the first substitution gas flow passage to heat the substitution gas;

a second reaction gas flow passage configured to supply the second reaction gas into the process vessel;
a second substitution gas flow passage configured to supply the substitution gas into the process vessel;
a second inert gas flow passage configured to supply the inert gas to the second reaction gas flow passage when the second reaction gas is supplied;
a second substitution gas heating part installed in the second substitution gas flow passage to heat the substitution gas; and
a valve device in which a first valve part including a portion where the first substitution gas flow passage, the first reaction gas flow passage and the first inert gas flow passage join, and a second valve part including a portion where the second substitution gas flow passage, the second reaction gas flow passage and the second inert gas flow passage join are successively installed and integrated,
wherein the first valve part comprises:
a first first valve body part configured to open and close the first reaction gas flow passage in a first first valve chamber and a first second valve body part configured to open and close the first substitution gas flow passage in a first second valve chamber are successively installed;
a first first gas introduction port configured to introduce the first reaction gas, a first second gas introduction port configured to introduce the inert gas or the substitution gas, and a first gas discharge port; and
a first gas discharge flow passage extending from the first first valve chamber to the first gas discharge port;
wherein the first reaction gas flow passage is opened to the first first valve chamber from the first first gas introduction port,
wherein the first inert gas flow passage is configured to communicate with the first gas discharge flow passage from the first second gas introduction port through a first orifice so as not to be opened and closed by either of the first first valve body part or the first second valve body part, and
wherein the first substitution gas flow passage is formed to join in a downstream side of the first orifice in the first inert gas flow passage from the first second gas introduction port through the first second valve chamber, and opened and closed by the first second valve body part, and
wherein the second valve part comprises:
a second first valve body part configured to open and close the second reaction gas flow passage in a second first valve chamber and a second second valve body part configured to open and close the second substitution gas flow passage in a second second valve chamber are successively installed;
a second first gas introduction port configured to introduce the second reaction gas, a second second gas introduction port configured to introduce the inert gas or the substitution gas, and a second gas discharge port; and
a second gas discharge flow passage extending from the second first valve chamber to the second gas discharge port;
wherein the second reaction gas flow passage is opened to the second first valve chamber from the second first gas introduction port,
wherein the second inert gas flow passage is configured to communicate with the second gas discharge flow passage from the second second gas introduction port through a second orifice so as not to be opened and closed by either of the second first valve body part or the second second valve body part,
wherein the second substitution gas flow passage is formed to join in a downstream side of the second orifice in the second inert gas flow passage from the second second gas introduction port through the second second valve chamber, and opened and closed by the second second valve body part, and
wherein the inert gas and the substitution gas are the same gas.

* * * * *